United States Patent [19]

Liu

[11] Patent Number: 4,596,670

[45] Date of Patent: Jun. 24, 1986

[54] EMI SHIELDING EFFECTIVENESS OF THERMOPLASTICS

[75] Inventor: Nan-I Liu, Mt. Vernon, Ind.

[73] Assignee: General Electric Company, Pittsfield, Mass.

[21] Appl. No.: 545,340

[22] Filed: Oct. 25, 1983

[51] Int. Cl.$^4$ .............................................. H01B 1/06
[52] U.S. Cl. .................................... 252/511; 524/439; 524/440; 524/441; 523/137
[58] Field of Search ............... 252/511, 503, 506, 502; 523/137; 524/439, 440, 441

[56] References Cited

U.S. PATENT DOCUMENTS

| | | | |
|---|---|---|---|
| 3,766,095 | 11/1971 | Mastrangelo | 252/513 |
| 4,243,460 | 1/1981 | Nagler | 156/275 |
| 4,388,422 | 6/1983 | Gerteisen et al. | 523/137 |
| 4,404,125 | 9/1983 | Abolins et al. | 252/511 |

FOREIGN PATENT DOCUMENTS

| | | |
|---|---|---|
| 118935 | 9/1980 | Japan . |
| 58-127743 | 1/1982 | Japan . |
| 58-127744 | 1/1982 | Japan . |
| 014635 | 1/1982 | Japan . |

OTHER PUBLICATIONS

Bigg, D. M. and E. J. Bradbury; "Conductive Polymeric Composites from Short Conductive Fibers"; Battelle, pp. 23–38.

Simon, R. M.; "EMI Shielding through Conductive Plastics", Polymer—Plastics Technology and Engineering, vol. 17(1), pp. 1–10 (1981).

Smoluk, G.; "Making the Right Choice in EMI/RFI Shielding Among . . . Fillers, Compounds, Coatings", Modern Plastics International, pp. 46–49, Sep., 1982.

Davenport, D. E.; "Metalloplastics: High Conductivity Materials", Polymer News, vol. 8, pp. 134–137, 1982.

Wehrenberg, R. H.; "Today's Conductive Plastics Combine Shielding plus Strength", Materials Engineering, pp. 37–43, Mar., 1982.

Galli, E.; "Expanding Options for EMI Shielding", Plastics Design Forum, pp. 17–26, Nov./Dec., 1982.

*Primary Examiner*—Josephine L. Barr
*Attorney, Agent, or Firm*—Edward K. Welch, II; William F. Mufatti; John W. Harbour

[57] ABSTRACT

Improved surface conductivity and EMI shielding effectiveness at high frequencies are obtained in thermoplastic compositions by the incorporation therein of a novel, synergistic combination of conductive fillers.

40 Claims, No Drawings

EMI SHIELDING EFFECTIVENESS OF THERMOPLASTICS

FIELD OF THE INVENTION

The present invention is concerned with conductive thermoplastic compositions having improved surface conductivity and improved electromagnetic/radio frequency interference (EMI/RFI) shielding effectiveness at high frequencies. These improved properties are obtained by the incorporation of conductive carbon powder in conductive thermoplastic compositions, wherein said conductive thermoplastic composition comprises a thermoplastic polymer having incorporated therein a synergistic combination of metal flake and one or more conductive fibers, preferably metal or metal coated fibers.

Electronic equipment, particularly sensitive electronic equipment such as computers, business machines, communications equipment and the like are all susceptible to malfunction as a result of EMI/RFI. Furthermore, in addition to being sensitive to foreign EMI/RFI, many of these electronic devices generate EMI/RFI. Previously, EMI/RFI shielding of electronic equipment was accomplished by conductive metallic housings. However, with the boom in the use of non-conductive plastic materials in the electronic industry, particularly as sturdy, lightweight housings, EMI/RFI has become a great problem.

Much research has been undertaken to provide plastic housings having EMI/RFI shielding effectiveness. Until recently, EMI/RFI shielding effectiveness in plastics was accomplished by conductive coatings, metallization, and plating of molded plastic parts. These methods, while effective, are costly and labor intensive in that they require substantial amounts of material and involve secondary operations in preparing the final product.

Recently, attempts have been made to prepare conductive plastics by incorporating in engineering thermoplastics certain conductive fillers. Specifically, these fillers include conductive powders, flakes and fibers. Generally, approximately 25–40% by wt. of conductive powder, 36–49% by wt. of conductive flake or 25–30% by wt. (in extruded parts, 3–6% in injection molded parts) of conductive fiber must be present in order to obtain EMI/RFI shielding. (Materials Engineering, March, 1982, P. 37–43; Modern Plastics International, September, 1982, P. 46–49).

More recently, attempts have been made to find synergistic combinations of conductive fillers so as to provide extrudable and/or moldable (i.e. injection molding, RIM, blow-molding and the like) compounds having consistent shielding at lower loadings which maintain properties in the finished part and are economical to make. Such combinations have included mixtures of flake and powder and mixtures of metallized glass fiber and carbon fibers. U.S. Pat. No. 4,404,125, assigned to the assignee of the present invention, discloses the use of aluminum flake and/or carbon fiber or a combination of either of them with carbon black powder.

Further, copending U.S. patent application Ser. No. 545,339 Filed Oct. 25, 1983, now U.S. Pat. No. 4,566,990, discloses conductive thermoplastics having high EMI/RFI shielding effectiveness by the incorporation therein of a synergistic combination of metal flake and metal or metal coated fiber.

Although these compositions have high overall EMI/RFI shielding effectiveness, they suffer from a loss of EMI/RFI shielding effectiveness of up to 10 dB or more at higher frequencies and a relatively low and inhomogeneous surface conductivity.

SUMMARY

It has now been discovered that conductive thermoplastic compositions may be prepared having high overall EMI/RFI shielding effectiveness, improved EMI/RFI shielding effectiveness at high frequencies and improved surface conductivity. Generally, these properties are exhibited in thermoplastic compositions which have incorporated therein a synergistic combination of conductive fillers, namely metal flake, conductive fiber and conductive carbon powder.

Specifically, the novel compositions of the present invention comprise:

(a) a thermoplastic polymer or polymer blend in which is incorporated (b) a combination of conductive fillers consisting essentially of (1) from about 25 to about 50% by weight of metal flake, (2) from about 2 to about 12% by weight of conductive fiber, and (3) from about 2 to about 15% by weight of conductive carbon powder; wherein the weight ratio of metal flake to conductive fiber is from about 4:1 to about 14:1.

Especially preferred conductive compositions are those where the conductive filler (b) consists essentially of (1) from about 25 to about 40% by weight of metal flake, (2) from about 4 to about 8% by weight of conductive fiber and (3) from about 3 to about 10% by weight of conductive carbon powder, wherein the weight ratio of metal flake to conductive fiber is from about 6:1 to about 10:1.

Preferred thermoplastic polymers for which the invention is applicable include polyesters, polycarbonates, copolyestercarbonates, polyamides, polyarylene ether sulfones and ketones, polystyrenes, acrylonitrile butadiene styrene copolymers, polyetherimides, polyamide-imides, polyphenylene ethers or blends thereof. These thermoplastic polymers may further comprise one or more addition polymers and/or one or more rubber or rubber modified thermoplastic resins.

Suitable metal flakes may be prepared from aluminum, copper, silver or nickel or alloys thereof. Any known conductive fibers may be used in the compositions of the present invention, however, the preferred fibers are metal or metal coated fibers. Metal fibers may be selected from the group consisting of silver, copper, nickel, aluminum or stainless steel. The metal coated fibers comprise a base fiber of glass, graphite and the like upon which a metal coat of nickel, silver, copper or aluminum is applied.

The compositions may further comprise up to about 25% of glass fibers for reinforcement and/or effective amounts of flame retardants.

The novel compositions or composition of this invention can be molded, foamed or extruded into various structures or articles, especially electronic equipment components or housings, requiring EMI shielding, and such structures or articles are included within the scope of this invention.

DESCRIPTION OF THE PREFERRED EMBODIMENTS

The present invention provides for thermoplastic compositions comprising a thermoplastic condensation polymer or polymer blend and a synergistic combination of conductive metal flake, conductive fiber(s) and conductive carbon powder having high overall EMI/RFI shielding effectiveness, improved EMI/RFI shielding effectiveness at high frequencies and improved surface conductivity. In order to realize said synergism, it is necessary to employ from about 25 to about 50%, preferably from about 25 to about 40%, by wt., based on the total composition, of metal flake; from about 2 to about 12%, preferably from about 4 to about 8%, by wt., based on the total composition, of conductive fiber and from about 2% to about 15%, preferably from about 3% to about 10% by weight, based on the total composition, of conductive carbon powder. Furthermore, the weight ratio of flake to fiber should be from about 4:1 to 14:1, preferably from about 6:1 to about 10:1, to obtain the most cost effective materials.

Metal flakes suitable for use in the compositions of the present invention include those prepared from the following metals or alloys thereof: silver, aluminum, nickel, copper and the like. Generally, suitable flake will have a thickness of about 0.005" or less and surface dimensions of approximately 0.100" or less. A preferred flake which has been found to be highly effective is one having a size of approximately 0.001"×0.040"×0.060".

Additionally, the metal flakes may be treated with suitable coupling agents including for example, silane or titanate coupling agents to improve processability and/or promote compatibility or bonding of the metal flake to the thermoplastic resin. Suitable metal flakes are available from a number of sources including Transmet Corp. of Columbus, Ohio and Atlantic Powered Metals, Inc. of New York, N.Y.

Conductive fibers useful herein are generally any known in the art, e.g. carbon fibers, however, it is especially preferred that the fibers be metal or metal coated fibers. The metal and metal coated fibers useful in the present composition are varied and widely available. Generally, the metal fibers may be made of aluminum, copper, silver, nickel, stainless steel and the like, and alloys thereof. Similarly, the metal coated fibers are generally of a graphite or glass core with a coating of silver, nickel, aluminum or copper and the like and alloys thereof. Sources of these fibers include Transmet Corp. of Columbus, Ohio; M.B. Associates of San Ramon, Calif.; Brunswick Technetics of Deland, Fla; American Cyanamid of Wayne, N.J.; Nichimen America Inc., N.Y., N.Y.; Bekaert Steel Wire Corp. of Pittsburgh, Penn.; and Lundy Electronics of Pompano Beach, Fla., among others.

Suitable fibers may be of essentially any length and diameter which is practical from both a composition and processing standpoint, as known in the art. For example, aluminum fibers measuring 6 mm in length by 90 microns diameter are useful and practical, whereas stainless steel fibers of similar dimensions may be impractical and cause unnecessary wear on processing equipment: instead stainless steel fibers of 3 mm length by 4 microns diameter may be more suitable. Generally, all suitable fibers will have a length of about 14 mm or less, preferably about 7 mm or less and a diameter of 0.2 mm or less, preferably of 0.1 mm or less. Once again, the actual dimensions of the fibers used depends in part on the composition of the fibers and their availability.

Additionally, the fibers used in the present invention may be coated with any suitable sizing or coupling agents so as to improve processability as well as bonding and/or compatibility of the fibers and the thermoplastic material. Preferred coupling agents include those derived from silane and titanates.

The carbon powders employed in the present invention are of the highly conductive, non-reinforcing type. They may be either furnace, channel or thermal carbon powders and generally have a particle size of less than about 50 millimicrons, preferably less than about 35 millimicrons. Especially preferred are the furnace type carbon powders wherein the particles are in aggregate form. Generally, the carbon powders are available from a number of commercial sources including Cabot Corp. of Billerica, Mass. and Union Carbide Corp. of Danbury, Conn.

It is also possible, in accordance with the present invention, to use more than one type of metal flake and/or conductive fiber in the compositions of the present invention.

The aforementioned synergistic conductive filler combination is useful in most any thermoplastic polymer or polymer blend. Suitable thermoplastic polymers include polyesters, polycarbonates, copolyestercarbonates, polyamides, polystyrenes, acrylonitrile butadiene styrene copolymers, polyarylate ether sulfones or ketones, polyphenylene ethers, polyamide-imides, polyetherimides or blends thereof. It has also been found that EMI/RFI shielding effectiveness of blends incorporating therein the synergistic conductive filler combination often have even greater enhancement of EMI/RFI shielding than the single plastic polymer alone.

(a) POLYESTERS

Suitable polyesters for the present invention are derived from one or more aliphatic and/or cycloaliphatic glycols and one or more aromatic dicarboxylic acids. The glycol may be selected from the group consisting essentially of ethylene glycol; 2 methyl-1,3 propanediol; 1,4-butanediol; 1,5-pentanediol; 1,6-hexanediol and 1,4-cyclohexanedimethanol, and the like. Suitable dicarboxylic acids include terephthalic acid, phthalic acid, isophthalic acid and naphthalene 2,6-dicarboxylic acid. The polyesters of the present invention may also contain minor amounts of other units such as aliphatic dicarboxylic acids and/or aliphatic polyols to form copolyesters.

Generally, the polyesters of the present invention may be represented by the formula

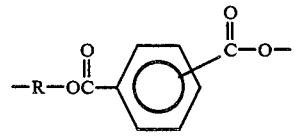

wherein R represents the divalent radical remaining after removal of the hydroxy groups from the glycol. Preferred polyesters include poly(ethylene terephthalate), poly(butylene terephthalate) and blends thereof.

The polyesters described herein are either commercially available or can be produced by methods well known in the art, such as those set forth in U.S. Pat. Nos. 2,465,319; 3,047,539 and 2,910,466, herein incorporated by reference. Further, the polyesters used herein have an intrinsic viscosity of from about 0.4 to about 2.0 dl/g as measured in 60:40 phenol/tetrachloroethane mixture or a similar solvent at 30° C.

(b) POLYCARBONATES

Any of the polycarbonates known in the art may be used in accordance with the present invention. Especially preferred polycarbonates are the aromatic polycarbonates. Aromatic polycarbonates useful herein are homopolymers, copolymers and mixtures thereof, which have an intrinsic viscosity of from about 0.3 to about 1.0 dl/g as measured in methylene chloride at 25° C.

Generally, the aromatic polycarbonates are prepared by reacting a dihydric phenol with a carbonate precursor such as phosgene, a haloformate or a carbonate ester. Typical of the dihydric phenols that may be employed are 2,2-bis(4-hydroxyphenyl)propane; bis(4-hydroxyphenyl)methane; 2,2-bis(4-hydroxy-3-methylphenyl)propane; 3,3'-dichloro-4,4'-dihydroxy diphenyl)methane and the like. The aromatic polycarbonates may be formed in accordance with the methods set forth in U.S. Pat. Nos. 2,999,835; 3,028,365; 2,999,844; 4,018,750 and 4,123,435, all incorporated herein by reference, as well as other processes known to those skilled in the art.

The polycarbonates so produced are typified as possessing recurring structural units of the formula

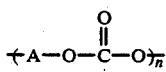

wherein A is a divalent aromatic radical of the dihydric phenol employed in the polymer producing reaction and n is greater than 1, preferably from about 10 to about 400.

It is of course possible to employ two or more different dihydric phenols or a dihydric phenol in combination with a glycol, a hydroxy or acid terminated polyester, or a dibasic acid in the event a carbonate copolymer or copolyester carbonate rather than a homopolymer polycarbonate is desired for use in the practice of the invention. Thus, it should be understood that the term "polycarbonate resin" embraces within its scope carbonate co-polymers.

Suitable copolymers also include those polycarbonate copolymers which comprise units derived from a first dihydric phenol which is a bis(hydroxyaryl)sulfone and a second dihydric phenol such as 2,2-bis(4-hydroxyphenyl)propane as disclosed in U.S. Pat. Nos. 3,737,409; and 2,999,846.

(c) POLYARYLENE ETHER SULFONES AND KETONES

Poly(arylether) resin components suitable for use herein are linear, thermoplastic polyarylene polyether polysulfones, wherein the arylene units are interspersed with ether and sulfone linkages. These resins may be obtained by the reaction of an alkali metal double salt of a dihydric phenol and a dihalobenzenoid compound, either or both of which contain a sulfone or ketone linkage i.e., $-SO_2-$ or $-CO-$ between arylene groupings, to provide sulfone or ketone units in the polymer chain in addition to arylene units and ether units. The polysulfone polymer has basic structure comprising recurring units of the formula:

—O—E—O—E'— wherein E is the presiduum of the dihydric phenol and E' is the residuum of the benzenoid compound having an inert electron withdrawing group in at least one of the positions ortho and para to the valence bonds; both of said residua are valently bonded to the ether oxygens through aromatic carbon atoms. Such polysulfones are included within the class of polyarylene polyether resin described in, for example, U.S. Pat. Nos. 3,264,536 and 4,108,837, herein incorporated by reference.

The residuum of the dihydric phenol, E, is derived from dinuclear phenols having the structure:

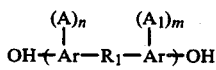

wherein Ar is an aromatic group and preferably is a phenylene group, A and $A_1$ may be the same or different inert substituent groups, such as alkyl groups having from 1 to 4 carbon atoms halogen atoms or alkoxy radicals having from 1 to 4 carbon atoms, n and m are integers having a value of 0 to 4, inclusive, and $R_1$ is representative of a bond between aromatic carbon atoms as in dihydroxydiphenyl, or is a divalent radical including, for example, CO, O, S, S—S, $SO_2$ or a divalent organic hydrocarbon radical, such as alkylene, alkylidene, cycloalkylene, cycloalkylidene, or the halogen, alkyl, or aryl or like substituted alkylene, alkylidene, cycloalkylene and cycloalkylidene radicals.

The poly(arylene ether)s have a reduced viscosity of from about 0.4 to about 1.5 dl/g as measured in an appropriate solvent at an appropriate temperature depending on the particular polyether, such as in methylene chloride at 25° C. The preferred poly(arylene ether)s have repeating units of the formula:

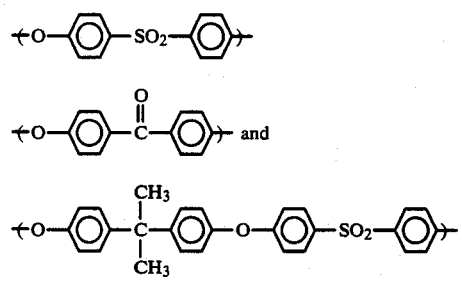

(d) POLYAMIDES

Polyamides suitable for the present invention may be obtained by polymerizing a monoaminomono-carboxylic acid or a lactam thereof having at least 2 carbon atoms between the amino and caraboxylic acid group; or by polymerizing substantially equimoler proportions of a diamine which contains at least 2 carbon atoms between the amino groups and a dicarboxylic acid; or by polymerizing a monoaminocarboxylic acid or a lactam thereof as defined above together with substantially equimolecular proportions of a diamine and a dicarboxylic acid. The dicarboxylic acid may be used in the form of a functional derivative thereof, for example an ester.

The term "substantially equimolecular" proportions (of the diamine and of the dicarboxylic acid) is used to cover both strict equimolecular proportions and slight departures therefrom which are involved in conventional techniques for stabilizing the viscosity of the resultant polyamides.

Examples of the aforementioned monoaminomonocarboxylic acids or lactams thereof which are useful in preparing the polyamides include those compounds containing from 2 to 16 carbon atoms between the amino and carboxylic acid groups, said carbon atoms forming a ring with the —CO—NH— group in the case of a lactam. As particular examples of aminocarboxylic acids and lactams there may be mentioned ε-aminocaproic acid, butyrolactam, pivalolactam, caprolactam, capryllactam, enantholactam, undecanolactam, dodecanolactam and 3- and 4- aminobenzoic acids.

Examples of diamines suitable for preparing the polyamides include diamines of the general formula

wherein n is an integer of from 2 to 16, such as trimethylenediamine, tetramethylenediamine, pentamethylenediamine, octamethylenediamine and especially hexamethylenediamine.

The dicarboxylic acids may be aromatic, for example isophthalic and terephthalic acids. Preferred dicarboxylic acids are of the formula

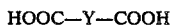

wherein Y represents a divalent aliphatic radical containing at least 2 carbon atoms, and examples of such acids are sebacic acid, octadecanedoic acid, suberic acid, glutaric acid, pimelic acid and adipic acid.

Preferred polyamides or nylons, as they are often called, include nylon 6, 6/6, 11, 12, 6/3, 6/4 and 6/12. The number average molecular weights of the polyamides useful in the invention are generally above about 10,000.

(e) POLYAMIDE-IMIDES

The polyamide-imide copolymers useful for the present invention generally have a crystalline structure and a melting point of over about 340° C. They are prepared by the reaction of dianhydrides with diamines containing preformed amide groups resulting in an amide-imide structure as follows:

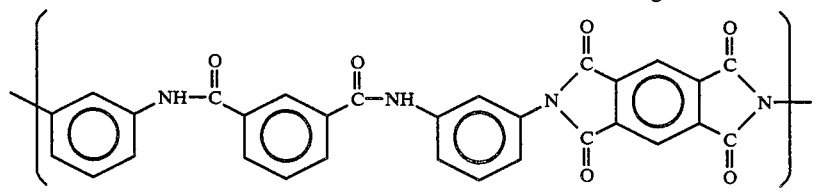

Other copolymers can be prepared by the reaction of trimelletic anhydride acid chloride with aromatic diamines. These copolymers can be prepared by the methods disclosed in Supplement Volume, Kirk - Othmer Encyclopedia of Chemical Technology, pages 746-773 (1971).

(f) POLYPHENYLENE ETHER

The polyphenylene ether resins useful for the present invention comprise homopolymers and copolymers of structural units of the formula:

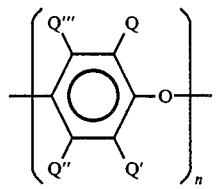

wherein Q, Q', Q" and Q''' are independently selected from the group consisting of hydrogen, hydrocarbon radicals, halohydrocarbon radicals having at least 2 carbon atoms between the halogen atom and the phenyl nucleus, hydrocarbonoxy radicals and halohydrocarbonoxy radicals having at least 2 carbon atoms between the halogen atom and phenyl nucleus, and Q', Q" and Q''' in addition may be halogen with the proviso that Q and Q' are both free of a tertiary carbon atom; and n represents the total number of monomer residues and is an interger of at least 50.

The preferred polyphenylene ether resin is a poly(2,6-dimethyl-1,4-phenylene)ether resin having an intrinsic viscosity of from about 0.3 dl/g to about 0.60 dl/g in chloroform. The polyphenylene ether resins useful herein are well known in the art and may be prepared from a number of catalytic and non-catalytic processes from corresponding phenols or reactive derivates thereof. Examples of polyphenylene ethers and methods for their production are disclosed in U.S. Pat. Nos. 3,306,874; 3,306,875; 3,257,357 and 3,257,358. All incorporated herein by reference.

(g) POLYETHERIMIDES

Polyetherimides useful for the present invention may be prepared from the reaction between substantially equimolar amounts of aromatic bis(ether anhydride)s of the formula,

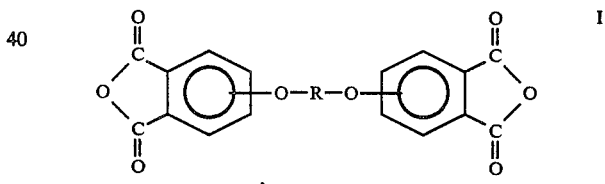

and organic diamine of the formula,

The reaction may take place in the presence or absence of a solvent and/or catalytic agent or compound as known in the art.

As shown in formula I, R is a member selected from the class consisting of (a) the following divalent organic radicals:

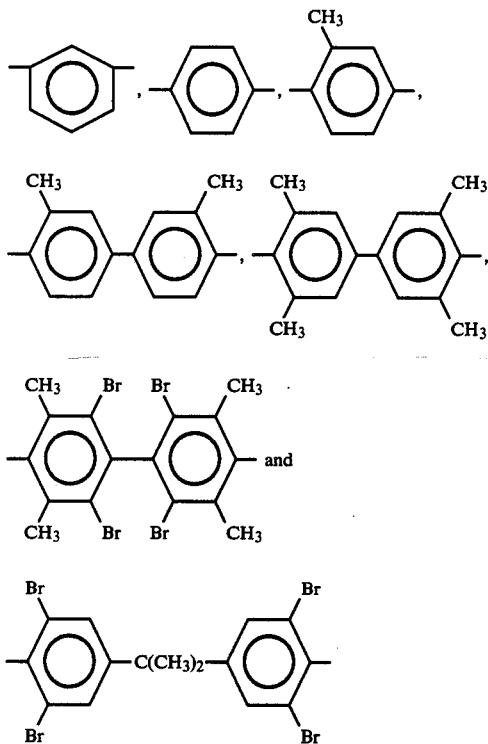

and (b) divalent organic radicals of the general formula

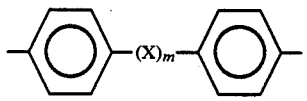

where X is a member selected from the class consisting of divalent radicals of the formula

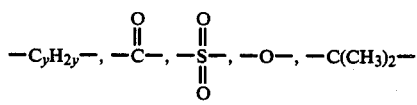

and —S—, m is 0 or 1, and y is a whole number from 1 to 5. As shown in formula II, R' is a divalent organic radical selected from the class consisting of (a) aromatic hydrocarbon radicals having from 6–20 carbon atoms and halogenated derivates thereof, (b) alkylene radicals, $C_{(2-8)}$ alkylene terminated polydiorganosiloxane, cycloalkylene radicals having from 2–20 carbon atoms and (c) divalent radicals included by the formula,

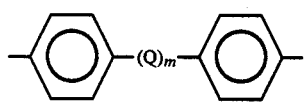

where Q is a member selected from the class consisting of

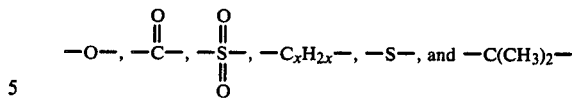

and x is a whole number from 1 to 5 inclusive, and m is as previously defined. These polyimides are prepared by methods well known in the art such as those described in, for example, U.S. Pat. Nos. 3,917,643; 3,852,242; 3,855,176; 3,833,546; 3,875,116; 3,838,097; 3,905,942 and 3,933,749, all incorporated herein by reference.

(h) ACRYLONITRILE BUTADIENE STYRENE COPOLYMERS

In general, ABS type polymers contain two or more polymeric parts of different compositions which are bonded chemically. The polymer is preferably prepared by polymerizing a conjugated diene, such as butadiene or a conjugated diene with a monomer copolymerizable therewith, such as styrene, to provide a polymeric backbone. After formation of the backbone, at least one grafting monomer, and preferably two, are polymerized in the presence of the prepolymerized backbone to obtain the graft polymer. These resins are prepared by methods well known in the art.

The backbone polymer, as mentioned, is preferably a conjugated diene polymer such as polybutadiene, polyisoprene, or a copolymer, such as butadienestyrene, butadiene-acrylonitrile, or the like.

The specific conjugated diene monomers normally utilized in preparing the backbone of the graft polymer are generically described by the following formula:

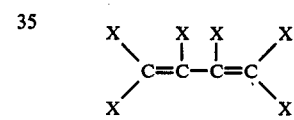

wherein X is selected from the group consisting of hydrogen, alkyl groups containing from one to five carbon atoms, chlorine or bromine. Examples of dienes that may be used are butadiene, isoprene, 1,3-heptadiene, methyl-1,3-pentadiene; 2,3-dimethyl-1,3-butadiene, 2-ethyl-1,3-pentadiene; 1,3- and 2,4-hexadienes, chloro and bromo substituted butadienes such as dichlorobutadiene, bromobutadiene, dibromobutadiene, mixtures thereof, and the like. A preferred conjugated diene is butadiene.

One monomer or group of monomers that may be polymerized in the presence of the prepolymerized backbone are monovinylaromatic hydrocarbons. The monovinylaromatic monomers utilized are generically described by the following formula:

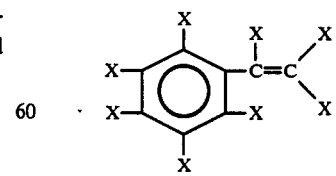

wherein X is as previously defined. Examples of the monovinylaromatic compounds and alkyl-, cycloalkyl-, aryl-, alkaryl-, aralkyl-, alkoxy-, aryloxy-, and other substituted vinylaromatic compounds include styrene, 3-methylstyrene; 3,5-diethylstyrene, 4-n-propylstyrene, α-methylstyrene, α-methyl vinyltoluene, α-chlorostyrene, α-bromostyrene, dichlorostyrene, dibromostyrene, tetera-chlorostyrene, mixtures thereof, and the like. The preferred monovinylaromatic hydrocarbons used are styrene and/or α-methylstyrene.

A second group of monomers that may be polymerized in the presence of the prepolymerized backbone are acrylic monomers such as acrylonitrile, substituted acrylonitrile and/or acrylic acid esters, exemplified by acrylonitrile, and alkyl acrylates such as methyl methacrylate.

The acrylonitrile, substituted acrylonitrile, or acrylic acid esters are described generically by the following formula:

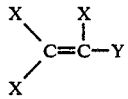

wherein X is as previously defined and Y is selected from the group consisting of cyano and carbalkoxy wherein the alkoxy group of the carbalkoxy contains from one to about twelve carbon atoms. Examples of such monomers include acrylonitrile, ethacrylonitrile, methacrylonitrile, α-chloroacrylonitrile, β-chloroacrylonitrile, α-bromoacrylonitrile, and β-bromoacrylonitrile, methyl acrylate, methyl methacrylate, ethyl acrylate, butyl acrylate, propyl acrylate, isopropyl acrylate, and mixtures thereof. The preferred acrylic monomer is acrylonitrile and the preferred acrylic acid esters are ethyl acrylate and methyl methacrylate.

In the preparation of the graft polymer, the conjugated diolefin polymer or copolymer exemplified by a 1,3-butadiene polymer or copolymer comprises about 50% by weight of the total graft polymer composition. The monomers polymerized in the presence of the backbone, exemplified by styrene and acrylonitrile, comprise from about 40 to about 95% by weight of the total graft polymer composition.

The second group of grafting monomers, exemplified by acrylonitrile, ethyl acrylate or methyl methacrylate, of the graft polymer composition, preferably comprise from about 10% to about 40% by weight of the total graft copolymer composition. The monovinylaromatic hydrocarbon exemplified by styrene comprise from about 30 to about 70% by weight of the total graft polymer composition.

In preparing the polymer, it is normal to have a certain percentage of the polymerizing monomers that are grafted on the backbone combine with each other and occur as free copolymer. If styrene is utilized as one of the grafting monomers and acrylonitrile as the second grafting monomer, a certain portion of the composition will copolymerize as free styrene-acrylonitrile copolymer. In the case where α-methylstyrene (or other monomer) is substituted for the styrene in the composition used in preparing the graft polymer, a certain percentage of the composition may be an α-methylstyrene-acrylonitrile copolymer. Also, there are occasions where a copolymer, such as α-methylstyrene-acrylonitrile, is added to the graft polymer copolymer blend. When the graft as polymer-copolymer blend is referred to herein, it is meant optionally to include at least one copolymer blended with the graft polymer composition and which may contain up to 90% of free copolymer.

Optionally, the elastomeric backbone may be an acrylate rubber, such as one based on n-butyl acrylate, ethylacrylate, 2-ethylhexylacrylate, and the like. Additionally, minor amounts of a diene may be copolymerized in the acrylate rubber backbone to yield improved grafting with the matrix polymer.

These resins are well known in the art and many are commercially available.

It is also possible to use blends of the foregoing thermoplastic condensation polymers in the present invention. These blends often result in composition having enhanced EMI/RFI shielding effectiveness as compared to the single thermoplastic polymer. Exemplary of useful blends are poly(ethylene terephthalate)/poly(1,4-butylene terephthalate) and polycarbonate/poly(1,4-butylene terephthalate).

The EMI/RFI shielding compositions of the present invention may further comprise thermoplastic addition polymers, rubbers or rubber modified resins. Preferred addition polymers include those selected from the group consisting of styrene resins, alkyl acrylate resins, or combinations thereof. When used herein and in the appended claims, the terms "styrene resins" and "alkyl acrylate resins" are meant to be defined as set forth below.

Suitable styrene resins include homopolymers, copolymers and graft copolymers thereof. Especially preferred styrene resins include homopolymer polystyrene, ABS type graft copolymers, and core-shell type graft copolymers as disclosed in U.S. Pat. Nos. 4,180,494; 3,808,180; 4,096,202; 4,260,693 and 4,292,233. Also preferred are rubber modified polystyrene such as a butadiene rubber modified polystyrene also referred to as high impact polystyrene or HIPS; styrene-butadiene-styrene block copolymer such as the Kraton or Kraton-G polymers that are described in U.S. Pat. Nos. 3,646,162 and 3,595,942; the modified alpha and para substituted styrenes or any of the styrene resins disclosed in U.S. Pat. No. 3,383,435, all of the aforementioned patents herein incorporated by reference.

Alkyl acrylate resins which may be used herein include homopolymers and copolymers of alkyl acrylates and alkyl methacrylates in which the alkyl group contains from 1 to 8 carbon atoms, such as methyl acrylate, ethyl acrylate, butyl acrylate, methyl methacrylate, ethyl methacrylate and butyl methacrylate. Suitable copolymers include the copolymers of the foregoing with vinyl or allyl monomers (e.g. acrylonitrile, N-allymaleimide or N-vinyl maleimide) or with α-olefins (e.g. ethylene). Especially preferred alkyl acrylate resins are the homopolymers and copolymers of methyl methacrylate (e.g. polymethyl methacrylate).

Additional acrylic resins useful in the present invention include the core-shell type graft copolymers wherein the alkyl acrylate resin, alone or copolymerized with a vinylic monomer, may be grafted onto an elastomeric polyolefin hompolymer or copolymer backbone, such as polybutadiene, polybutadienestyrene, polyisoprene and/or butadiene-isoprene copolymers, or a elastomeric cross-linked acrylate or alkyl acrylate backbone, such as cross-linked n-butylacrylate. These resins are well known in the art (U.S. Pat. No. 4,034,013; U.S. Pat. No. 4,096,202; U.S. Pat. No. 3,808,180 among others) and are commercially available (for example Rohm & Haas Acryloid KM 653, KM 611 or KM330).

Also suitable for the present invention are rubbers including ethylene-propylene-diene monomer type rubbers and ethylene-propylene rubbers. Many of these are described in U.S. Pat. Nos. 2,933,480; 3,000,866; 3,407,158; 3,093,621 and 3,379,701.

Especially preferred compositions incorporating therein one or more of the aforementioned addition polymers and the like include polycarbonate/ABS compositions, polyphenylene ether/high impact polystyrene compositions, and polybutylene terephthalate/-ethylene ethylacrylate(EEA)-acrylic core-shell graft copolymers (Rohm & Haas KM-330).

Optionally, the compositions of this invention may further contain one or more reinforcing agents. Typical reinforcing agents useful for the invention include but are not limited to, glass fiber, mica or both. The filamentous glass that may be used in the embodiments of this invention is well known to those skilled in the art and is widely available from a number of manufacturers. The glass may be untreated or, preferably, treated with suitable coupling agents, especially preferred are the silane and titanate coupling agents. The glass filaments are made by standard processes, e.g., by steam or air blowing, flame blowing and mechanical pulling.

The thermoplastic compositions of the present invention may also be rendered flame retardant with an effective amount of a conventional flame retardant agent. As is well known, flame retardants can be based on elementary red phosphorus, phosphorus compounds, halogen and nitrogen compounds alone or preferably in further combination with synergists such as antimony compounds. Especially useful are polymeric and oligomeric flame retardant agents comprising tetrabromobisphenol-A carbonate units, e.g., U.S. Pat. No. 3,833,685, alone or in combination with an antimony compound.

The compositions of the present invention may be prepared by known methods. For example, the additive ingredients may be placed into an extrusion compounder with the thermoplastic resin to produce molding pellets wherein the additive ingredients are dispersed in a matrix of the thermoplastic resin. Alternatively, the ingredients may be mixed with a thermoplastic resin by dry blending, then either fluxed on a mill and comminuted, or extruded and chopped. Further, the ingredients may also be mixed with powder or granular thermoplastic resin and directly molded, e.g., by injection or transferred molding techniques.

Finally, the conductive thermoplastic composition of the present invention may be prepared by first forming a concentrate of any one or more conductive fillers in the base thermoplastic resin or any compatible thermoplastic resin (i.e. one which will not cause delamination in the blended composition) and then incorporating the concentrate into the composition by any of the foregoing methods or methods known in the art.

The compositions of the present invention have many advantages over the conductive thermoplastics of the prior art. Generally, these compositions have improved overall EMI/RFI shielding effectiveness. Most importantly, however, these compositions have greatly enhanced EMI/RFI shielding effectiveness at high frequencies combined with greatly improved surface conductivity.

The novel compositions or composites of this invention can be molded, foamed or extruded into various structures or articles, especially electronic equipment components or housings, requiring EMI/RFI shielding, and such structures or articles are included within the scope of this invention. Examples, but not limited thereto, are panel boards for printed circuits, radio and television panels and housings, and housings for computers and large calculators, audio and high fidelity equipment, sensitive test imstruments and the like.

In order that those skilled in the art may better understand how to practice the present invention, the following examples are given by way of illustration and not by way of limitation.

EMI Shielding effectiveness data was determined based on a coaxial transmission method developed by Battelle Laboratory of Columbus, Ohio. Shielding effectiveness is a measure of the attenuation of EMI/RFI expressed in decibels wherein attenuation is a function of the electrical conductivity and/or magnetic susceptability of the shield. The decibel unit is a logarithmic measure of the degree of the shielding. A 10 decibel reading indicates that 90% of the EMI/RFI energy is effectively dissipated. Twenty decibels means that 99% of the EMI/RFI is dissipated, and so on. The shielding effectiveness is measured at various radio frequencies (in MHz). In each of the following examples, shielding effectiveness was determined over a frequency range of 0.5 MHz to 1000 MHz.

Unless otherwise specified, the following compositions were prepared extrusion compounding.

EXAMPLE E1 COMPARATIVE EXAMPLE CE1

Compositions embodying the present invention and state of the art conductive compositions were prepared and tested to demonstrate their EMI/RFI shielding effectiveness and surface sensitivity. The formulations of these samples and their test results are presented in Table 1. Clearly, the compositions of the present invention have markedly improved EMI/RFI shielding effectiveness at high frequencies and reduced surface resistivity.

TABLE 1

|  | CE1 | E1 |
| --- | --- | --- |
| Poly(1,4-butylene terephthalate) | 54.8 | 43.8 |
| Aluminum Flake | 36 | 36 |
| Aluminum Fiber | 4 | 4 |
| Glass Fiber | 5 | 5 |
| Carbon Powder (Cabot XC-72) | — | 11 |
| Stabilizer | 0.2 | 0.2 |
| Shielding effectiveness (dB) |  |  |
| @ 0.5 MHz | 52 | 55 |
| 15 MHz | 51 | 51 |
| 250 MHz | 46 | 55 |
| 500 MHz | 45 | 54 |
| 1000 MHz | 43 | 57 |
| Surface Resistivity (ohm) | $6 \times 10^{13}$ | 100 |

EXAMPLES E2–E4

Compositions embodying the applicability of the present invention to other thermoplastic plymers as well as thermoplastic polymers blend were prepared and tested to demonstrate their EMI/RFI shielding effectiveness. The formulations of these samples and their test results are presented in Table 2.

TABLE 2

|  | E2 | E3 | E4 |
| --- | --- | --- | --- |
| Poly(butylene terephthalate)* | 40.6 | 40.6 | 51.7 |
| Poly(ethylene terephthalate) | 10 | — | — |
| Polycarbonate | — | 10 | — |
| Aluminum Flake | 36 | 36 | 36 |
| Aluminum Fiber | 4 | 4 | 4 |
| XC-72 carbon powder | 9.4 | 9.4 | 8.3 |
| Shielding effectiveness (dB) |  |  |  |
| @ 0.5 MHz | 45 | 44 | 43 |
| 15 MHz | 44 | 44 | 43 |

TABLE 2-continued

| | E2 | E3 | E4 |
|---|---|---|---|
| 250 MHz | 47 | 47 | 45 |
| 500 MHz | 53 | 51 | 51 |
| 1000 MHz | 62 | 67 | 68 |
| Surface Resistivity (ohm) | 1000 | 1000 | 2000 |

*includes 0.2% by wt. of stabilizer

Obviously, other modifications and variations of the present invention are possible in light of the above teachings. For example, these compositions may further comprise plasticizers, antioxidants, stabilizers, flow promoters, mold release agents U.V. stabilizers, and the like, as necessary. It is therefore to be understood that changes may be made in the particular embodiments of the invention described which are within the full intended scope of the invention so defined by the appended claims.

I claim:

1. A conductive thermoplastic polymeric composition comprising
   (a) a thermoplastic resin or resin blend and
   (b) a synergistic combination of conductive fillers consisting essentially of
      (1) from about 25 to about 50% by weight based on the total composition of metal flake,
      (2) from about 2 to about 12% by weight based on the total composition of conductive carbon, metal or metal coated fiber and
      (3) from about 2 to about 15% by weight based on the total composition of conductive carbon powder, wherein the weight ratio of metal flake to fiber is from about 4:1 to about 14:1.

2. The composition of claim 1 wherein the thermoplastic resin (a) is selected from the group consisting of polyesters, polycarbonates, polyamides, polyphenylene ethers, co-polyestercarbonates, polystyrenes, acrylonitrile butadiene styrene copolymers, polyarylate ether sulfones or ketones, polyamide imides, polyetherimides and blends thereof.

3. A composition as defined in claim 2 wherein the polyester has repeating units of the general formula

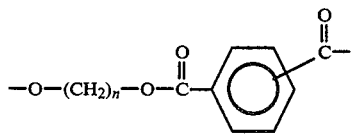

wherein n is a whole number of from 2 to 4.

4. The composition of claim 3 wherein the polyester is poly(1,4-butylene terephthalate).

5. The composition of claim 3 wherein the polyester is poly(ethylene terephthalate).

6. A composition of claim 2 wherein the polycarbonate is an aromatic polycarbonate derived from 2,2 bis(4-hydroxy phenyl)propane.

7. A composition of claim 2 wherein the polyamide is Nylon 6,6.

8. A composition of claim 2 wherein the thermoplastic resin (a) is a blend of poly(ethylene terephthalate) and poly(1,4-butylene terephthalate).

9. A composition of claim 2 wherein the thermoplastic resin (a) is a blend of polycarbonate and poly(1,4-butylene terephthalate).

10. A composition of claim 2 wherein the thermoplastic resin (a) is a blend of polycarbonate and poly(ethylene terephthalate).

11. The composition of claim 2 wherein the thermoplastic condensation polymer is polyphenylene ether.

12. The composition of claim 11 which further comprises a rubber or a rubber modified thermoplastic resin selected from the group consisting of high impact polystyrene, rubber modified alpha-substituted or para-substituted styrene polymers, ethylene-propylene rubber and ethylene propylene-diene monomer rubbers.

13. The composition of claim 2 wherein the thermoplastic condensation polymer (a) is a blend of polyphenylene ether and high impact polystyrene.

14. A composition as defined in claim 2 which further comprises a thermoplastic addition polymer resin.

15. The composition of claim 14 wherein the thermoplastic addition polymer resin is selected from the group consisting of a styrene resin, an alkyl acrylate resin or a mixture of any of the foregoing.

16. The composition of claim 15 wherein the thermoplastic addition polymer resin is acrylonitrilebutadienestyrene resin.

17. The composition of claim 6 which further comprises acrylonitrile-butadiene-styrene resin.

18. The composition of claim 15 wherein the thermoplastic addition polymer is a graft copolymer selected from the group consisting of core-shell type acrylic elastomers, acrylic copolymers and vinylic copolymers.

19. The composition of claim 15 wherein the addition polymer is a blend of a graft copolymer and ethylene ethylacrylate.

20. A composition as defined in claim 2 which further comprises a rubber or a rubber modified resin selected from the group consisting essentially of high impact polystyrene, rubber modified substituted styrene resins, ethylene-propylene-diene monomer rubbers and ethylene-propylene rubbers.

21. The composition as defined in claim 1 wherein the metal flake is present in an amount of from about 30 to about 40% by weight.

22. The composition as defined in claim 1 wherein the metal flake is selected from the group consisting essentially of aluminum flake, nickel flake, copper flake, silver flake and flakes prepared from alloys thereof.

23. The composition of claim 21 wherein the flake is Aluminum or aluminum alloy.

24. The composition of claim 1 wherein the weight ratio of flake to fiber is from about 6:1 to about 10:1.

25. The composition of claim 1 wherein the conductive fiber is present in an amount of from about 4 to about 8% by weight based on the total composition.

26. The composition of claim 1 wherein the conductive fiber is a metal fiber selected from the group consisting essentially of aluminum fiber, stainless steel fibers, nickel fibers, copper fibers, silver fibers and fiber prepared from alloys thereof.

27. The composition of claim 1 wherein the conductive fiber is a metal coated fiber selected from the group consisting essentially of metal coated glass and carbon fibers.

28. The composition of claim 27 wherein the metal coating is selected from the group consisting essentially of nickel, aluminum, copper, silver and alloys thereof.

29. The composition of claim 27 wherein the metal coated fiber is aluminum coated glass fiber.

30. The composition of claim 27 wherein the metal coated fiber is nickel coated graphite fiber.

31. The composition of claim 1 wherein the conductive fiber is carbon fiber.

32. The composition of claim 1 wherein the conductive carbon powder is present in an amount of from about 3% to about 10% by weight based on the total composition.

33. The composition of claim 1 which further comprises from about 3 to about 25% by weight of glass fiber.

34. The composition as defined in claim 2 which further comprises from about 3 to about 25% by weight of glass fibers.

35. The composition as defined in claim 14 which further comprises from about 3 to about 25% by weight of glass fibers.

36. The composition as defined in claim 20 which further comprises from about 3 to about 25% by weight of glass fibers.

37. The composition of claim 1 which further comprises an effective amount of flame retardant.

38. The composition of claim 33 which further comprises an effective amount of flame retardant.

39. The composition of claim 37 wherein the flame retardant is selected from the group consisting essentially of halogenated bisphenols based polycarbonate and phosphorus compounds, either alone or in combination with an antimony compound.

40. The composition of claim 1 wherein the metal fiber is aluminum or aluminum alloy fiber.

* * * * *